United States Patent
Srinivas et al.

(10) Patent No.: US 9,418,788 B2
(45) Date of Patent: Aug. 16, 2016

(54) PRECISION HALF CELL FOR SUB-FEMTO UNIT CAP AND CAPACITIVE DAC ARCHITECTURE IN SAR ADC

(71) Applicant: Apple Inc., Cupertino, CA (US)

(72) Inventors: Vijay Srinivas, Sunnyvale, CA (US); Mansour Keramat, San Jose, CA (US); Yuan-Ju Chao, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/643,478

(22) Filed: Mar. 10, 2015

(65) Prior Publication Data

US 2015/0263754 A1    Sep. 17, 2015

Related U.S. Application Data

(60) Provisional application No. 61/953,905, filed on Mar. 16, 2014.

(51) Int. Cl.

| | |
|---|---|
| *H03M 1/66* | (2006.01) |
| *H01G 4/01* | (2006.01) |
| *H01G 4/228* | (2006.01) |
| *H01G 4/38* | (2006.01) |
| *H01G 4/12* | (2006.01) |
| *H03M 1/46* | (2006.01) |

(52) U.S. Cl.
CPC ............... *H01G 4/01* (2013.01); *H01G 4/228* (2013.01); *H01G 4/38* (2013.01); *H01G 4/129* (2013.01); *H03M 1/468* (2013.01)

(58) Field of Classification Search
CPC .......... H01L 27/108; H01G 4/01; H01G 4/38; H03M 1/001; H03M 1/66; H03M 1/38; H03M 1/442

USPC ......... 341/155, 144, 143, 163, 172, 150, 161; 257/306, 303, 298, 296; 438/253
See application file for complete search history.

(56) References Cited

U.S. PATENT DOCUMENTS

| | | | | |
|---|---|---|---|---|
| 6,597,562 | B1 | 7/2003 | Hu et al. | |
| 7,446,365 | B1* | 11/2008 | Heshami | H01L 23/5223 257/296 |
| 7,956,438 | B2 | 6/2011 | Quinn | |
| 7,994,609 | B2 | 8/2011 | Quinn | |
| 2006/0152886 | A1* | 7/2006 | Togashi | H01G 4/012 361/306.3 |
| 2012/0286394 | A1* | 11/2012 | Sutardja | H01G 4/005 257/532 |
| 2013/0334657 | A1* | 12/2013 | Cho | H01L 28/82 257/532 |
| 2014/0049872 | A1* | 2/2014 | Huang | H01G 4/30 361/301.4 |

* cited by examiner

*Primary Examiner* — Peguy Jean Pierre
(74) *Attorney, Agent, or Firm* — Meyertons, Hood, Kivlin, Kowert & Goetzel, P.C.

(57) ABSTRACT

A capacitive device is disclosed, including a first conductor formed on a lower metal layer and coupled to a first terminal. A second conductor is formed on an upper metal layer and a plurality of wires is partitioned into groups, each group including one wire from a respective metal layer. First and second wires of each group are coupled to a second terminal. A third wire of each group, adjacent to the first wire, is coupled to the first conductor. A fourth wire of each group, adjacent to the second wire, is coupled to the second conductor. Fifth wires of a first subset of the groups are coupled to the second conductor and fifth wires of a second subset of the groups are coupled to the first conductor. The fifth wire of each group is adjacent to the first wire and the second wire.

20 Claims, 8 Drawing Sheets

US 9,418,788 B2

PRECISION HALF CELL FOR SUB-FEMTO UNIT CAP AND CAPACITIVE DAC ARCHITECTURE IN SAR ADC

PRIORITY CLAIM

The present application claims benefit of priority to provisional application No. 61/953,905 titled "PRECISION HALF CELL FOR SUB-FEMTO UNIT CAP AND CAPACITIVE DAC ARCHITECTURE IN SAR ADC" and filed on Mar. 16, 2014.

BACKGROUND

1. Technical Field

Embodiments described herein are related to the field of capacitors used in semiconductor devices. More particularly, these embodiments relate to methods for implementing capacitors within an analog-to-digital converter circuit.

2. Description of the Related Art

An array of capacitors may be used as part of a digital-to-analog converter (DAC) circuit. DAC circuits are used in some analog-to-digital converter (ADC) architectures, such as successive approximation register (SAR) ADCs, for example. Small, accurately matched, capacitors are desirable for a DAC used in a SAR ADC to produce an accurate digital value representing a given analog signal input. SAR ADCs are used in some integrated circuits (ICs) designs, such as some system-on-a-chip (SoC) designs.

Some ICs are manufactured in a semiconductor fabrication process that includes multiple layers of metal interconnects which are used to connect various circuit devices to each other to create various functional blocks that may be found in a given IC, including DACs and ADCs. The metal layers are separated from each other by a non-conductive layer, such as silicon dioxide (i.e., glass, or referred to herein as an "oxide layer" or simply "oxide"). Capacitors may be constructed from these multiple metal layers by processing each metal layer in a given region into specific shapes, such as wires and plates, and then connecting the various wires and plates to form a capacitor.

To use capacitors in an IC design, a basic building block may be utilized, referred to herein as a unit capacitor cell. A unit capacitor cell in a given IC design may have a unit value of capacitance and building capacitors with a capacitance greater than the unit value requires combining two or more unit capacitor cells, allowing capacitors to be designed with capacitance values equal to an integer multiple of the unit value.

In some IC designs, however, some circuits may benefit from a capacitor whose value that is not an integer multiple of a unit value of a unit capacitor cell. A method of designing and replicating a capacitor cell with capacitance less than one unit value is desired.

SUMMARY OF THE EMBODIMENTS

Various embodiments of a capacitive device are disclosed. Broadly speaking, a capacitive device includes a first conductor formed on a lower metal wiring layer of a plurality of metal wiring layers, wherein the first conductor is coupled to a first terminal. The capacitive device also includes a second conductor formed on an upper metal wiring layer of the plurality of metal wiring layers, and a plurality of parallel wires partitioned into a plurality of groups, wherein parallel wires included in each group of the plurality of groups are formed on a respective one of a subset of the plurality of metal wiring layers, wherein the subset of the plurality of metal wiring layers is between the upper metal wiring layer and the lower metal wiring layer. A first parallel wire and a second parallel wire of each group of the plurality of groups are coupled to a second terminal. A third parallel wire of each group of the plurality of groups is coupled to the first conductor, wherein the third parallel wire is adjacent to the first parallel wire. A fourth parallel wire of each group of the plurality of groups is coupled to the second conductor, wherein the fourth parallel wire is adjacent to the second parallel wire. A fifth parallel wire of each group of a first subset of the plurality groups is coupled to the second conductor, and wherein the fifth parallel wire of each group of a second subset of the plurality of groups is coupled to the first conductor. Also, the fifth parallel wire of each group of the plurality of groups is adjacent to the first parallel wire and the second parallel wire.

In a further embodiment, the first subset of the plurality of groups is mutually exclusive to the second subset of the plurality of groups. In a still further embodiment, a number of groups included in the first subset of the plurality of groups is equal to a number of groups included in the second subset of the plurality of groups.

In another embodiment, an edge of the third parallel wire included in a given group of the plurality of groups is parallel to an edge of the third parallel wire included in any other given group of the plurality of groups. In one embodiment, a dielectric material is included between each adjacent parallel wire in a given group of the plurality of groups.

In a given embodiment, the second conductor is coupled to a third terminal. In a further embodiment, the third terminal is coupled to a ground voltage reference.

BRIEF DESCRIPTION OF THE DRAWINGS

The following detailed description makes reference to the accompanying drawings, which are now briefly described.

DETAILED DESCRIPTION

To construct a desired capacitor value in an IC design, such as in an analog-to-digital converter (ADC) unit, an array of unit capacitor cells may be utilized. Employing such an array, may require connecting terminals of two or more unit capacitor cells in parallel, allowing capacitors to be designed with capacitance values equal to an integer multiple of the unit value. To build a capacitor with a capacitance value that is not an integer multiple of a unit value of a capacitor cell, a sub-unit capacitor cell with capacitance less than one unit value may be employed. As used herein, a sub-unit capacitor cell refers to a capacitor cell in which the capacitance value is less than one unit value of capacitance. For example, the capacitance of a unit capacitor cell may be 10 femtofarads, making the capacitance value of a sub-unit capacitor anything less than 10 femtofarads.

Figure 1:
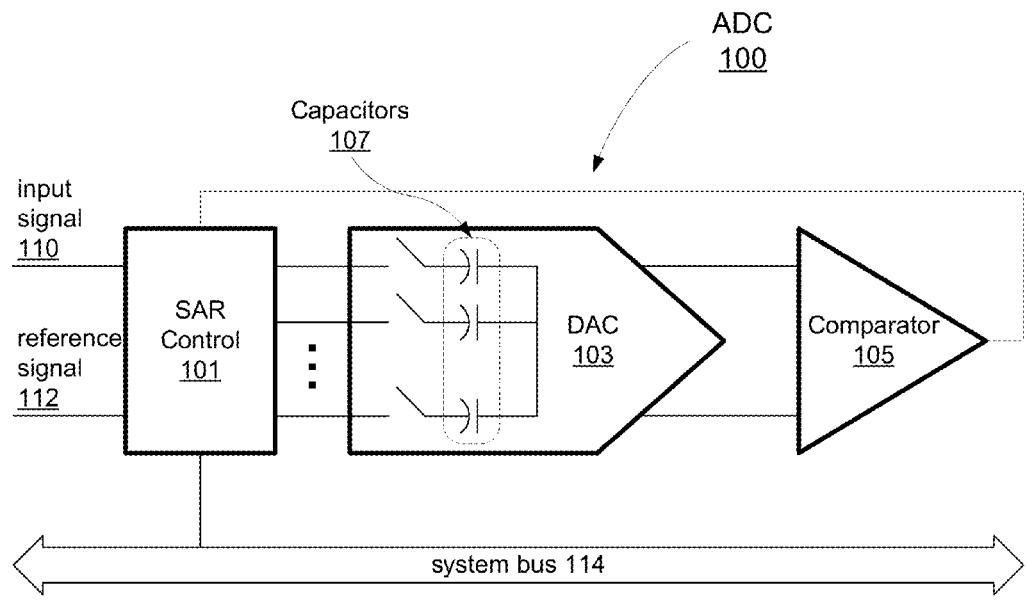
FIG. 1 illustrates a block diagram of an embodiment of an analog-to-digital converter.

In FIG. 1, a block diagram of an embodiment of an analog-to-digital converter is illustrated. ADC 100 is an embodiment of a successive approximation register (SAR) ADC which may be included in an SoC device. ADC 100 includes SAR control unit 101, digital-to-analog converter (DAC) 103, and comparator circuit 105. ADC 100 receives input signal 110 to be measured, reference signal 112, and communicates with other portions of SoC via system bus 114.

SAR control unit 101 may correspond to a state machine or other suitable processing unit designed to adjust and route signals to DAC 103 and comparator 105 in order to determine a digital value corresponding to a voltage level of an input signal. In operation, SAR control unit 101 may receive a command via system bus 114 to begin a measurement of the voltage level of input signal 110. In response to receiving the command, SAR control unit adjusts switches in DAC 103 to couple input signal 110 to a first terminal of each of a plurality of capacitors 107 within DAC 103 and adjust switches to couple a second terminal of each of capacitors 107 to a ground signal. Each of capacitors 107 will begin charging and SAR control unit 101 allows the various capacitors to charge to a voltage level equal to the voltage level of input signal 110, at which point SAR control unit 101 decouples the first terminal from input signal 110. This process is sometimes referred to as "sampling the input."

DAC 103 is implemented as a capacitive DAC, i.e., an array of capacitors are used rather than an array of resistors such as used in resistive DACs. DAC 103 may receive a series of digital signals from SAR control unit 101 and, in response, output a corresponding voltage level. DAC 103 includes capacitors 107 and a plurality of switches that enable the first terminal of each of capacitors 107 to be independently coupled to either input signal 110 or reference signal 112. Capacitors 107 are designed such that a first capacitor has a first capacitance value and each additional capacitor has a capacitance value equal to one half of the capacitance of the prior capacitor. For example, if the first capacitor has a capacitance of 'C,' then the second capacitor would have a capacitance of ½ C, the third would have a capacitance of ¼ C, then ⅛ C, and so on.

Once input signal 110 has been sampled, then SAR control unit 101 couples the first terminal of the first capacitor to reference signal 112, then couples the second terminal of each of the plurality of capacitors to a first input of comparator circuit 105. An output of the comparator corresponds to the most significant bit (MSB) of a value corresponding to the voltage level of input signal 110. SAR control circuit 101 decouples the second terminal of the capacitors from comparator circuit 105 and then couples the first terminal of the second capacitor to reference signal 112 and then again couples the second terminal of each capacitor to the first input of comparator circuit 105. The updated output of the comparator corresponds to the second MSB of the value corresponding to the voltage level of input signal 110. This process repeats until all bits of the value corresponding to the voltage level of input signal 110 have been determined. In various embodiments, the result may be stored in a register within SAR control unit 101 or may be output onto system bus 114.

A total number of capacitors required for DAC 103 is dependent upon a resolution of ADC 100, i.e., a number of bits of the value representing the voltage of input signal 110 (i.e., the result). At least one capacitor is needed for each bit. In some embodiments, additional capacitors may be required for sampling input signal 110, for stabilizing or adjusting reference signal 112, for general noise reduction, etc. Accuracy for ADC 100 is dependent on the relative capacitance values of each capacitor for each bit of the result. As mentioned above, if the capacitance for the first capacitor corresponding to the MSB is 'C', then the capacitance for the second capacitor corresponding to the second MSB needs to be ½ C for the best possible accuracy. The more the capacitance of the second capacitor deviates from ½ C, the less accurate the measurement for the second MSB will be. The same principal applies to the remaining capacitors of the plurality of capacitors. Therefore, it may be desirable that design of DAC 103 include capacitor designs that can be adjusted to a fine resolution of capacitance.

The total capacitor value is dictated by the performance requirement. The total size of the capacitor array is, however, determined by the smallest unit cell that can be generated to satisfy the matching requirement. In some embodiments, when compared to other DAC designs, such as, for example, a resistive ladder DAC, a capacitive DAC such as DAC 103 may have advantages including compact area and low power.

It is noted that ADC 100 of FIG. 1 is merely an example for demonstration of disclosed concepts. Some functional components and some operational details have been omitted to focus on the disclosed subject matter. In other embodiments, additional functional units may be included and operation may deviate from the description above.

Figure 2:
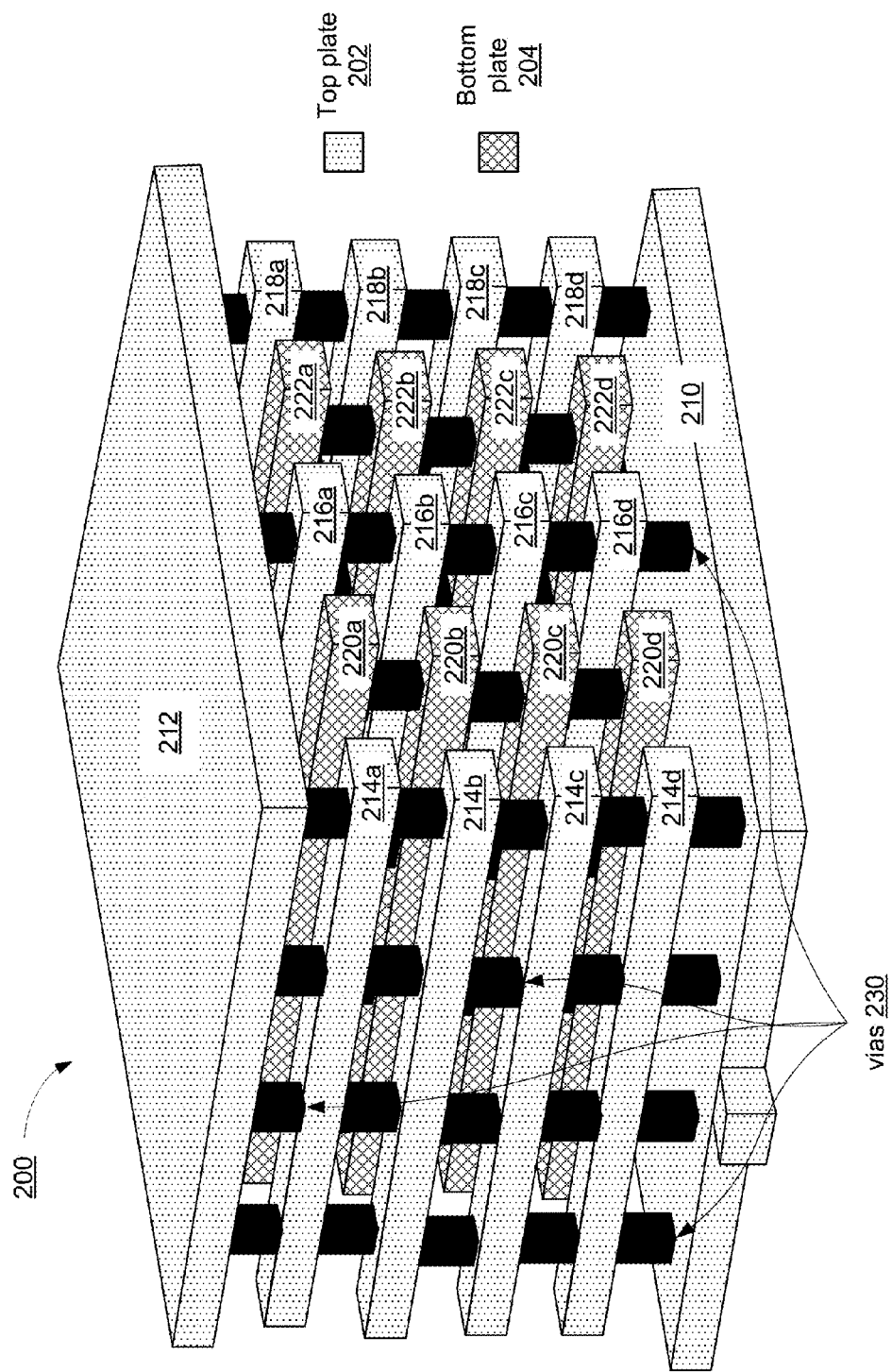
FIG. 2 shows a first embodiment of a structure for a unit capacitor cell.

Turning to FIG. 2, an embodiment of a structure for the ADC unit capacitor cell is shown. Unit capacitor cell 200 may be one structure used in a capacitive DAC in an SoC, such as, e.g., DAC 103, to create capacitors of various capacitances by linking to other unit capacitor cells. Unit capacitor cell 200 is a three dimensional structure employing a plurality of metal layers formed during manufacture of the SoC. Generally speaking, metal layers in a semiconductor manufacturing process may be referred to in the order each layer is deposited onto circuits of an IC, from the first layer (metal-1) to the last layer (metal-6 as illustrated). Unit capacitor cell 200 includes top plate 202 and bottom plate 204 which correspond to a first terminal and a second terminal of a capacitor encompassing unit capacitor cell 200. Top plate 202 and bottom plate 204 each include respective portions of a plurality of wires (wire 214a through wire 222d) created in metal-2 through metal-5, with the wires all running parallel to each other within unit capacitor cell 200. Unit capacitor cell 200 also includes conductors 210 and 212.

Top plate 202 includes conductors 210 and 212 formed in metal-1 (conductor 210) and metal-6 (conductor 212). Between conductor 210 and conductor 212, multiple layers of wires (wire 214a through wire 222d) are created in metal-2 through metal-5. A first portion of the wires (wires 214a-d, 216a-d, and 218a-d) are connected through metal vias (examples of which are highlighted as vias 230) to each other and to conductors 210 and 212 to form top plate 202. Bottom plate 204 includes wires 220a-d and wires 222a-d in metal layers 2-5. Wires 220a-d are connected to each other by vias as are wires 222a-d. Wires 220a-d may be connected to wires 222a-d external by one or more of metal layers 2-5 external to the structure of unit capacitor cell 200.

The space around the wires 214-222 and conductors 210 and 212 are filled by a dielectric material (not illustrated), such as, for example silicon dioxide. Silicon dioxide is a commonly used dielectric to form capacitors in ICs and is also referred to herein as "oxide." Capacitance is created in unit capacitor cell 200 due to effects of electric fields surrounding wires 220a-d on wires 214a-d and 216a-d and electric fields surrounding wires 222a-d on wires 216a-d and wires 218a-d. Capacitance may also be created from coupling of wires 220d and 222d to conductor 210 and from coupling of wires 220a and 222a to conductor 212. The amount of capacitance of unit capacitor cell 200 is determined by the length and size of the wires 214-222, the spacing between the wires, and the properties of the dielectric used between wires of top plate 202 and wires of bottom plate 204.

Bottom plate 204 may be a sensitive node and parasitic stray capacitances from other circuits near unit capacitor cell 200 may couple unwanted signals to bottom plate 204. In various embodiments, it may be advantageous to minimize such coupling to bottom plate 204. In the architecture of unit capacitor cell 200, bottom plate 204 is covered by the top plate 202 on four sides. Conductors 210 and 212, as well as wires 214a-d and wires 218a-d, protect bottom plate 204 from external disturbances that may be generated due to other circuits near the capacitor cell.

Unit capacitor cell 200 may be designed towards a goal of achieving a uniform distribution of metal and oxide in order to create as consistent as possible capacitance value for all unit capacitor cells used in DAC 103. The structure of unit capacitor cell 200 includes arranging wires 214a-222d in an array, leading to a symmetrical layout which may achieve a uniform density. This may allow the manufacturing to be precise and accurate such that matching can be achieved between individual unit capacitor cells used in DAC 103.

It is noted that unit capacitor cell 200 in FIG. 2 is merely an example. In other embodiments, a number of metal layers included in the capacitor cell may differ. In addition, more than the illustrated five stacks of wires may be utilized. Structures other than those illustrated may be included as part of a given unit capacitor cell design.

Figure 3:
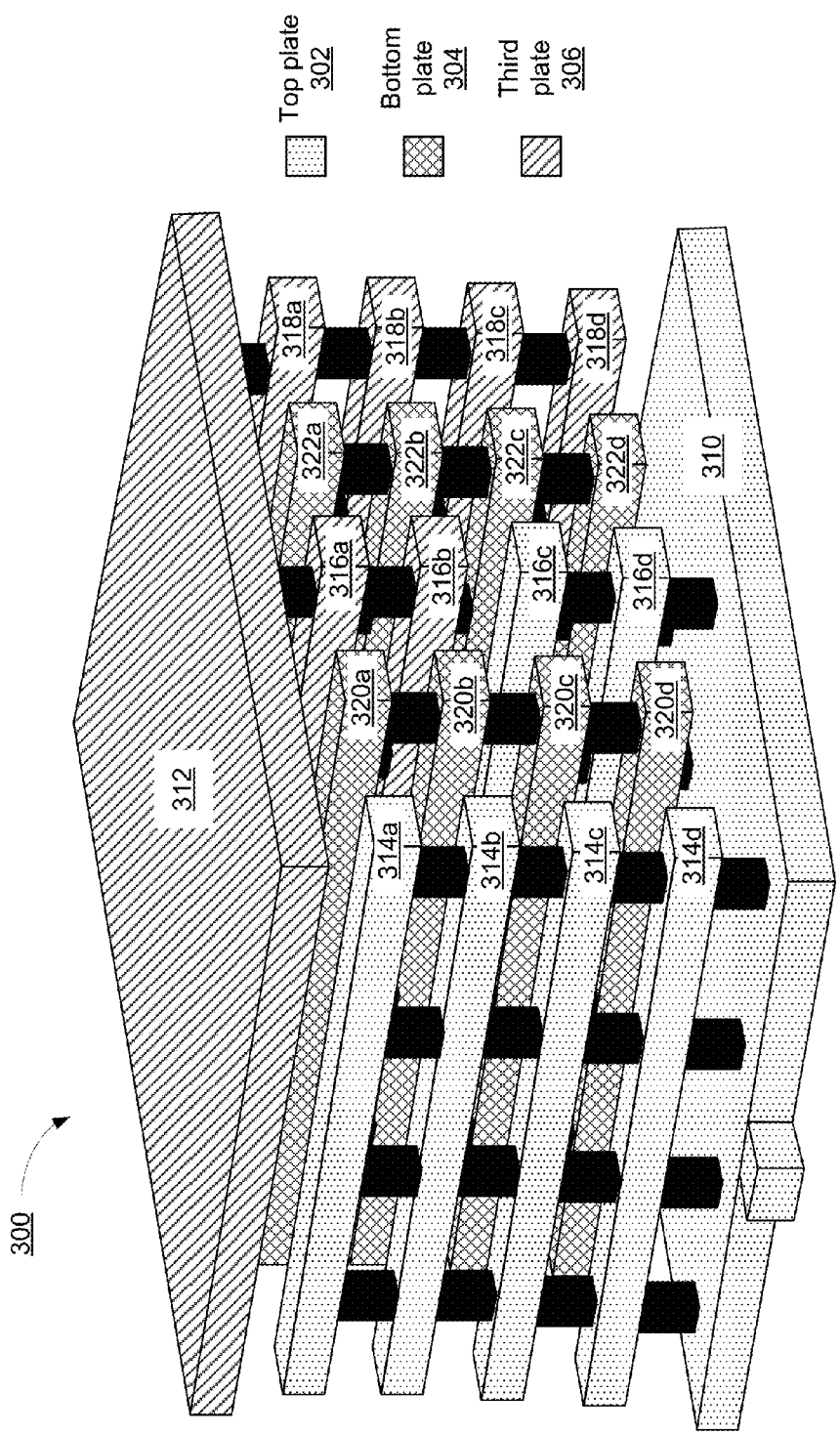
FIG. 3 illustrates an embodiment of a structure for a sub-unit capacitor cell.

Moving to FIG. 3 an embodiment of a structure for a sub-unit capacitor cell is illustrated. Sub-unit capacitor cell 300 may be another structure used in DAC 103 in FIG. 1 to create capacitors of various values. Sub-unit capacitor cell 300, similar to unit capacitor cell 200 in FIG. 2, is a three dimensional structure formed in a plurality of metal layers, and is designed to have a capacitance that is less than that of unit capacitor cell 200. Also similar to unit capacitor cell 200, sub-unit capacitor cell 300 includes top plate 302 and bottom plate 304, corresponding to a first terminal and a second terminal of a capacitor encompassing sub-unit capacitor cell 300. Also included in sub-unit capacitor cell 300 is third plate 306, corresponding to a third terminal of the capacitor encompassing sub-unit capacitor cell 300. Top plate 302, bottom plate 304, and third plate 306 each include respective portions of a plurality of wires (wire 314a through wire 322d) created in metal-2 through metal-5, with the wires all running parallel to each other within sub-unit capacitor cell 300. Sub-unit capacitor cell 300 also includes conductors 310 and 312.

Two capacitors may be formed in the single cell structure of sub-unit capacitor cell 300, with the capacitance of each capacitor less than that of unit capacitor cell 200. A first capacitor is formed between top plate 302 and bottom plate 304 while the second capacitor is formed between bottom plate 304 and third plate 306. Bottom plate 304 is created similarly to bottom plate 204 of unit capacitor cell 200, and includes wires 320a-d and 322a-d. Referring to a given layer of metal, such as, for example, the layer including wires 314d, 316d, 318d, 320d, and 322d, a first pair of wires, wire 320d and wire 322d, are coupled to bottom plate 304 (it is noted that a conductive coupling between wire 320d and 322d is not shown in FIG. 3). Wire 314d, adjacent to wire 320d, is coupled through vias to conductor 310 as part of top plate 302. Wire 318d, adjacent to wire 322d, is coupled through vias to conductor 312 as part of third plate 306. In the present embodiment, wires 316a-d are split into two subsets, with wires 316a-b in one subset and wires 316c-d in another subset. In the given layer of metal, wire 316d, which is adjacent to both wire 320d and wire 322d, is coupled to conductor 310 as part of top plate 310. It is noted that top plate 302 includes fewer wires than top plate 202 of unit capacitor cell 200. Only wires 314a-d and 316c-d are connected to conductor 310 through metal vias to form top plate 302. Wires 316a-b and 318a-d are connected to conductor 312 through vias to form third plate 306. In other words, the wires connected to conductor 310 are mutually exclusive to the wires connected to conductor 312.

Compared to unit capacitor cell 200 in FIG. 2, it may be seen how sub-unit capacitor cell 300 is created from a similar cell structure. By omitting a row of vias, wire 314a is not connected to conductor 312 the way that wire 214a is connected to conductor 212. Additionally, a row of vias may be omitted between wires 316b and 316c as well as between wire 318d and conductor 310. By omitting these three rows of vias, top plate 302 is disconnected from third plate 306. It is noted that, in the illustrated embodiment, top plate 302 and third plate 306 each include one conductor (310 and 312, respectively) and six wires (314a-d and 316 c-d in top plate 302 and 316a-b and 318a-d in third plate 306). In essence, top plate 202 of unit capacitor cell 200 is split in half to form top plate 302 and third plate 306 of sub-unit capacitor cell 300. In some embodiments, this equal distribution of wires and conductors between top plate 302 and third plate 306 may cause the capacitance of each of the two capacitors in sub-unit capacitor cell 300 to be one-half of the capacitance of unit capacitor cell 200. It may be observed that top plate 302 and bottom plate 304, in addition to including equal distributions of wires and conductors also forms an equivalent, symmetrical shape. The symmetry of the two plates may contribute, in some embodiments, to an accuracy of the capacitance of each of the two capacitors in sub-unit capacitor cell 300. By using top plate 302 and bottom plate 304 in place of top plate 202 and bottom plate 204, half as much capacitance may be added to a circuit. In such an embodiment, third plate 306 may be coupled to a ground reference signal or a power supply signal to be used as shielding for a sensitive signal coupled to bottom plate 304.

It is noted that sub-unit capacitor cell 300 is an example intended to demonstrate disclosed subject matter. In other embodiments, the structure of FIG. 3 may differ from the structure illustrated. For example, the various vias used to connect the wires and conductors may be repositioned or a number of rows or columns of wires may be different.

Figure 4:
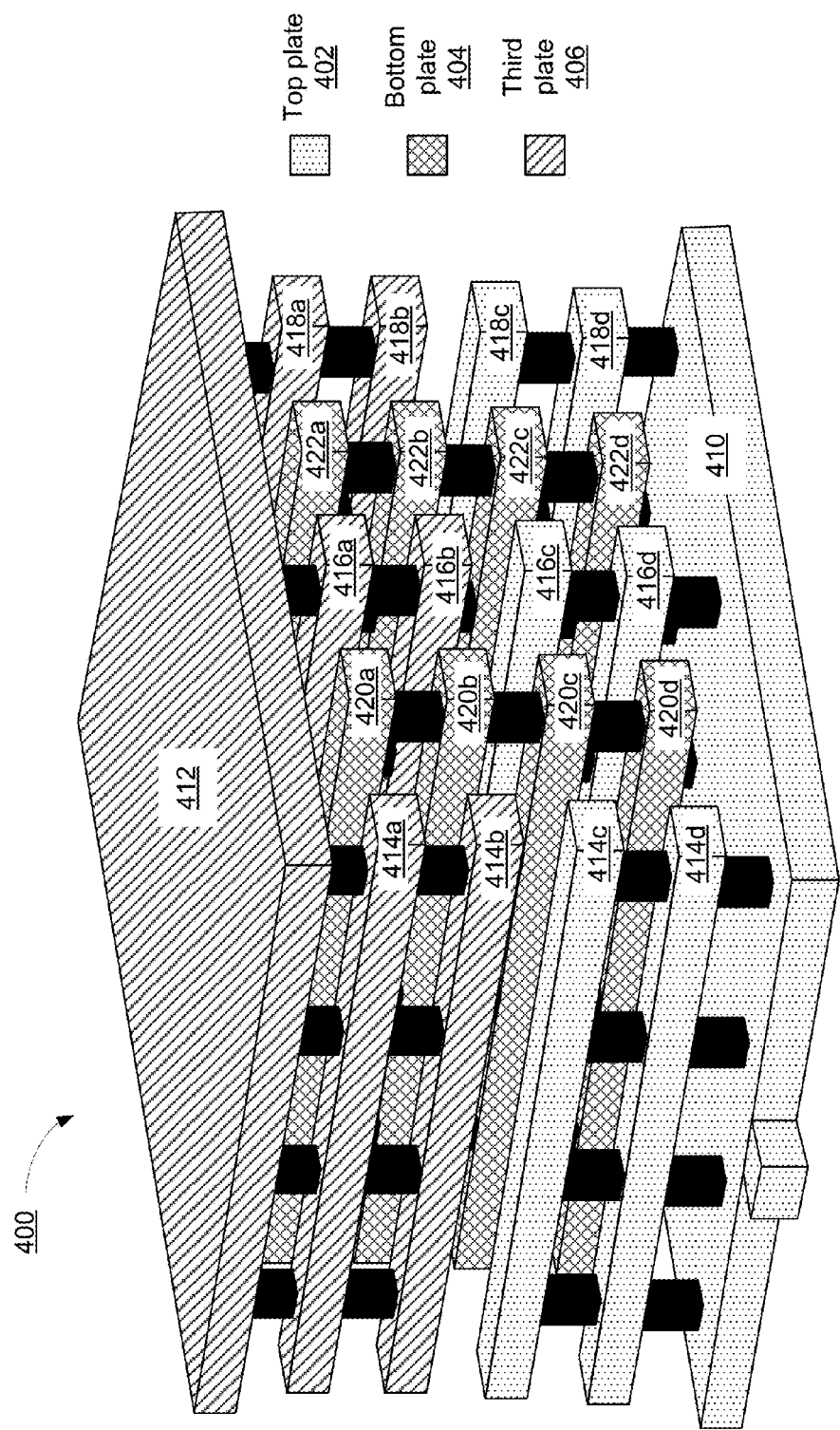
FIG. 4 illustrates an alternate embodiment of a structure for a sub-unit capacitor cell.

Turning now to FIG. 4, an alternate embodiment of a structure for a sub-unit capacitor cell is shown. Sub-unit capacitor cell 400 may be another structure used in DAC 103 in FIG. 1 to create capacitors of various values. Sub-unit capacitor cell 400, similar to unit capacitor cell 200 in FIG. 2 and sub-unit capacitor cell 300 in FIG. 3, is a three dimensional structure formed in a plurality of metal layers. Also, similar to sub-unit capacitor cell 300, sub-unit capacitor cell 400 includes top plate 402, bottom plate 404, and third plate 406. Top plate 402, bottom plate 404, and third plate 406 each include respective portions of a plurality of parallel wires (wire 414a through wire 422d) created in metal-2 through metal-5. Sub-unit capacitor cell 400 also includes conductors 410 and 412. Like sub-unit capacitor cell 300, sub-unit capacitor cell 400 may be used to create a capacitor cell with two capacitors, each capacitor with less capacitance than unit capacitor cell 200.

Compared to sub-unit capacitor cell 300 in FIG. 3, it may be seen how sub-unit capacitor cell 400 is created from the similar cell structure. In the embodiment illustrated in FIG. 3, four wires on one side of the cell structure, 314a-d, are connected to conductor 310 and four wires on the opposite side of the cell structure, 318a-d, are connected to conductor 312. In contrast, the embodiment illustrated in FIG. 4 has two wires on each of these two sides of the cell structure, which are connected to each conductor. Wires 414c-d and 418c-d are connected to conductor 410. Similarly, wires 414a-b and 418a-b are connected to conductor 412. It is noted that the wires in the middle of the cell structure, 416a-d, do not change connections, with 416a-b connected to conductor 412 and 416c-d connected to conductor 410.

It is noted that the design of sub-unit capacitor cell 400 creates top plate 402 out of metal-1 (conductor 410), metal-2 (wires 414d, 416d, and 418d) and metal-3 (wires 414c, 416c, and 418c) only, while third plate 406 includes only metal-6 (conductor 412), metal-5 (wires 414a, 416a, and 418a), and metal-4 (wires 414b, 416b, and 418b). Similar to sub-unit capacitor cell 300, each of top plate 402 and third plate 406 include six wires and one conductor, and consequently, the two capacitors are designed to each have a capacitance equal to one-half of the capacitance of unit capacitor cell 200. Since top plate 402 and third plate 406 do not include wires from a same metal layer, if a given metal layer, from metal-2 through metal-5, experiences non-conformities during manufacturing, the capacitor that includes the non-conforming metal layer may have a different capacitance from the other capacitor in the same cell structure. For example, if metal-4 is over etched during manufacturing, then wires 414b, 416b, 418b, 420b, and 422b may be thinner than the corresponding wires in the other metal layers. This difference may cause the capacitor from bottom plate 404 to third plate 406 to be lower than the capacitor from top plate 402 and bottom plate 404. If these capacitors are used in a design such as DAC 103 in FIG. 1, the accuracy of DAC may be negatively impacted. Metal layer non-conformities are addressed in further detail below.

It is noted that sub-unit capacitor cell 400 is merely an example. In other embodiments, the structure of FIG. 4 may differ from the structure illustrated. Dimensions may differ as well the number of metal layers used.

Figure 5:
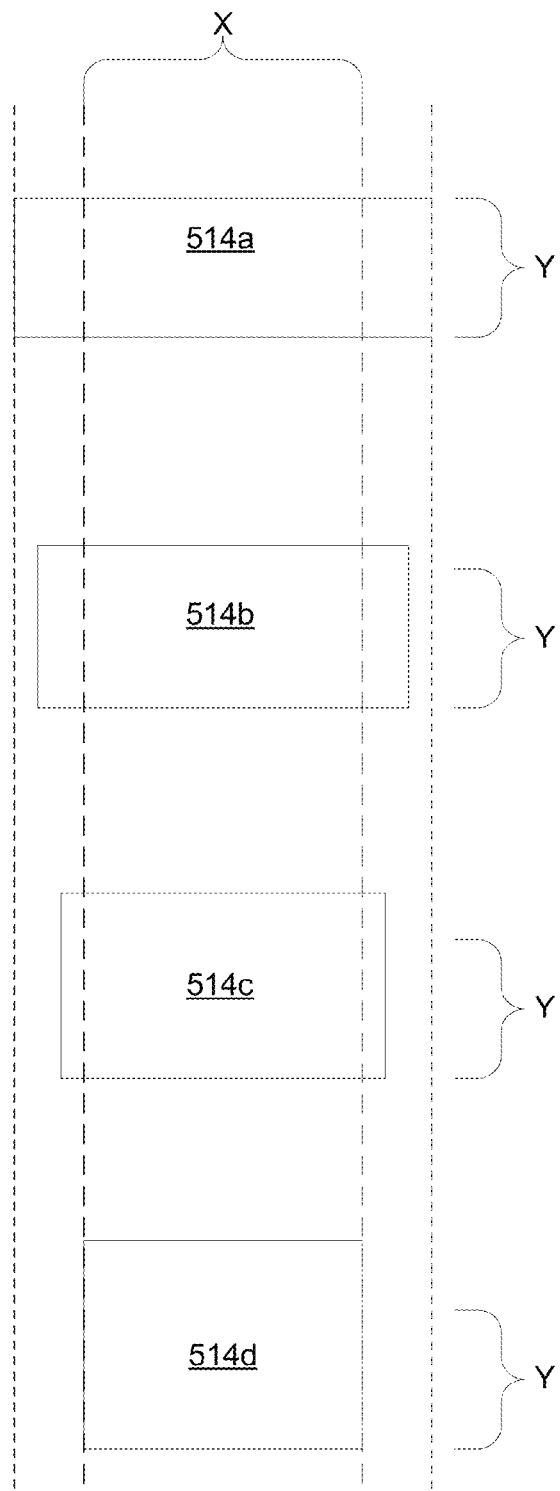
FIG. 5 illustrates a cross section of an embodiment of a single stack of wires used in an integrated circuit.

Moving now to FIG. 5, a cross section of an embodiment of a single stack of wires used in an integrated circuit is shown. The wires may correspond to any vertical stack of wires shown in FIGS. 2-4, such as, for example, wires 314a-d in FIG. 3 or 414a-d in FIG. 4. Wires 514a-d are shown as a cross section and, to correspond to FIGS. 2-4, are created in metal-2 (514d) through metal-5 (514a).

In the design of a unit or sub-unit capacitor cell, wires 514a-d may be drawn (either by hand or by IC design software) to be aligned vertically and to be of equal line widths and heights. In some semiconductor manufacturing processes, however, wires created in the various metal layers may have different dimensions despite being designed to be the same dimensions. In some cases, dimensional variations may be due to non-conformities as mentioned above in regards to FIG. 4. "Non-conformities" as used herein may refer to various processing steps during IC manufacturing that deviate from expected parameters. For example, non-conformities may include lithographic variations which may result in over-etching or under etching of a metal layer, resulting wires of differing widths. Non-conformities may also include depositing too much or too little metal or having an uneven deposition of a layer of metal, which may lead to wires that are taller or shorter than other wires in the same cell structure.

In some semiconductor manufacturing processes, a certain amount of dimensional variation may be expected. For example, some processes may include different design rules for each layer of metal to compensate for changes in thermal properties for each additional metal layer. A progressive widening of metal wires from metal-1 to metal-6 (and beyond) may, therefore, be an intentional design strategy in some processes.

In the illustrated example, wires 514a-d are shown to have varying line widths (the smallest labeled 'X') and varying wire heights (the smallest labeled 'Y'). As can be seen, the metal-2 wire (514d) is the thinnest and the metal-5 wire (514a) is the thickest, with the metal-3 (514c) and metal-4 (514b) layers increasing at each layer. In addition, the metal-2 wire (514d) is the tallest and the metal-5 wire (514a) is the shortest, with the metal-3 (514c) and metal-4 (514b) layers decreasing at each layer.

In many circuits, these dimensional variations of the metal layers may not have a significant impact on performance of the circuits. When these metal layers are used to create capacitors, however, the dimensional variations may impact the capacitance of capacitor cells such as those shown in FIGS. 2-4. Referring back to FIG. 4, if wires 414a-422d have relative wire thicknesses for each metal layer corresponding to FIG. 5, then the wires in metal-5 will be closer to each other than the wires of metal-1. As a result, the capacitance between top plate 402 and bottom plate 404 will be less than the capacitance between bottom plate 404 and third plate 406. In the design of DAC 103, sub-unit capacitor cell 400 may be used provide a capacitance value that is one half of the capacitance value of unit capacitor cell 200. Due to the wire thickness variations however, a capacitor created using top plate 402 and bottom plate 404 will have a capacitance that is less than one half of the capacitance of unit capacitor cell 200.

Sub-unit capacitor cell 300 of FIG. 3 may be used to mitigate at least a portion of the effects of wire thickness variations. If wires 314a-322d have relative wire thicknesses for each metal layer corresponding to FIG. 5, then the wires in metal-5 will be closer to each other than the wires of metal-1, just as in the FIG. 4 example. In sub-unit capacitor cell 300, however, since both top plate 302 and third plate 306 include wires from metal-2 through metal-5, the dimensional variations are mitigated to some degree. Wire 314a in metal-5 will be thicker than wire 318d in metal-2. Since wire 314a is included in top plate 302 and wire 318d is included in third plate 306, the variations between metal layers may be at least partially averaged out. The capacitance value between top plate 302 and bottom plate 304 may be closer to one half the capacitance of unit capacitor cell 200 than the capacitance value between top plate 402 and bottom plate 404 when created from similar cell structures.

It is noted that FIG. 5 is merely an example for demonstrating the disclosed subject matter. In other embodiments, dimensional variations between wires created in different metal layers may have different relative properties. For example, relative wire heights may not gradually decrease in each metal layer as shown on FIG. 5. Likewise, relative wire widths may not gradually increase in each metal layer as shown.

Figure 6A:
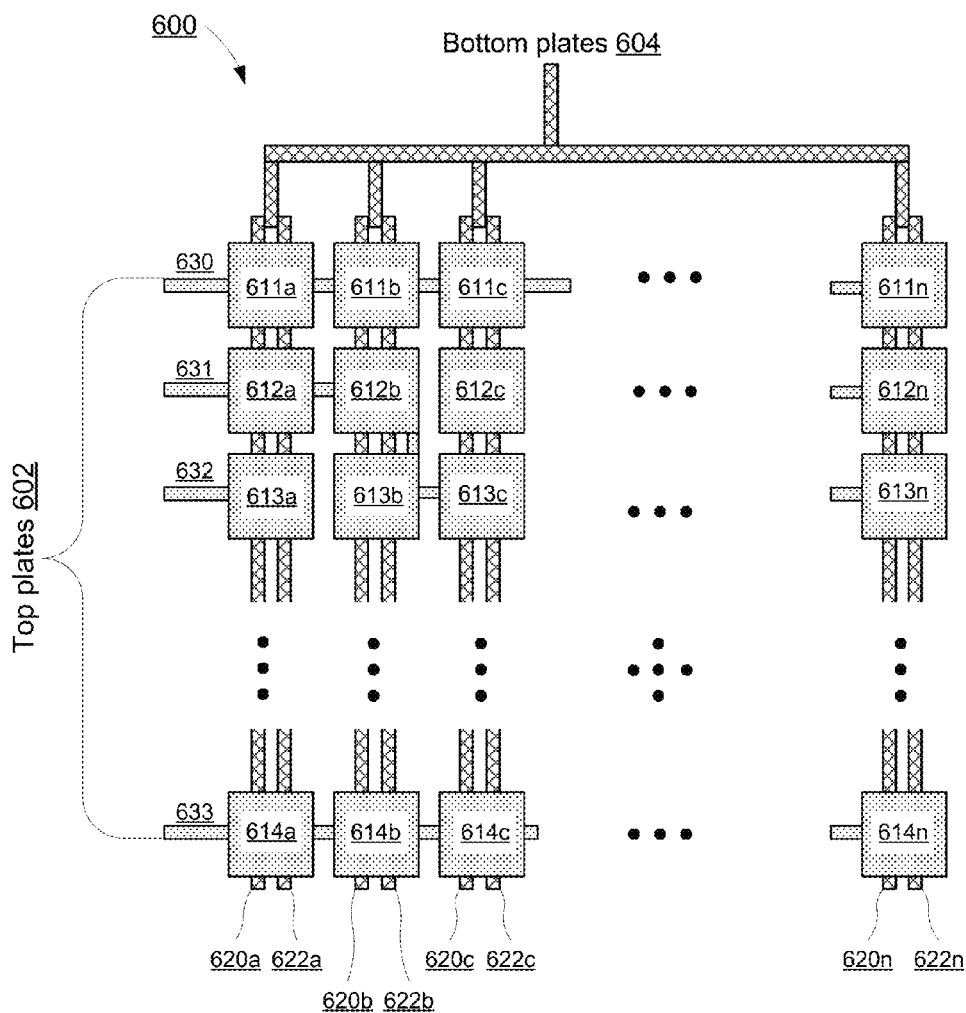
FIG. 6A shows a 2-dimensional representation of an array of capacitor cell structures.

FIG. 6A illustrates a 2-dimensional representation of an embodiment of an array of capacitor cell structures. Capacitor array 600 may correspond to a capacitor array used in a capacitive DAC circuit, such as, for example, DAC 103 in FIG. 1. Capacitor array 600 includes a plurality of cell structures, 611a through 614n, each of which can be designed as either a unit capacitor cell 200 of FIG. 2 or a sub-unit capacitor cell 300 of FIG. 3. The view of FIG. 6 is looking down at the top of the array of cell structures with the parallel wires (e.g. 314a-322d) running vertically from the top of the array to the bottom.

In the illustrated embodiment, bottom plates 604 of capacitor array 600 are connected to a common node. Wires 620a-n correspond to wires 220a or wires 320a in FIGS. 2 and 3, respectively, while wires 622a-n, likewise, correspond to wires 222a or wires 322a. While only wires created in metal-5 (i.e., 222a or 322a) may be visible in the figure, other wires aligned to 222a and 322a run underneath (e.g., 222b-d or 322b-d). By running the wires of the bottom plates of each cell structure 611a-614n through each neighboring cell structure, the bottom plates of each cell structure can be connected to the same node at the edge of the array in any of metal layers 2-5.

Top plates 602 are connected in various groups to create a plurality of capacitors, each with a capacitance value determined by a number of cell structures connected and by whether each of the connected cell structures is designed as a unit capacitor cell 200 or a sub-unit capacitor cell 300. In various embodiments, the plurality of capacitors may have a same capacitance value, a different capacitance value or any suitable combination thereof. In the present embodiment, four capacitors are shown, 630-633. Capacitor 630 includes cell structures 611a, 611b, and 611c. Capacitor 631 includes cell structures 612a, 612b, 613b, and 613c. Capacitor 632 includes cell structure 613a and capacitor 633 includes cell structures 614a, 614b, and 614c. Individual cell structures for each capacitor are joined in metal-1 by wires connected between each connector 210 or connector 310. As shown by capacitor 631, a capacitor can be created from cell structures from more than one row or column.

Figure 6B:
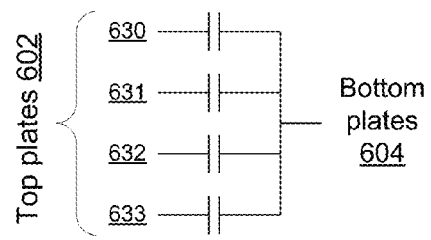
FIG. 6B illustrates a circuit diagram representing the array of capacitor cell structures.

Moving to FIG. 6B, an equivalent circuit for the capacitors 630-633 of FIG. 6A is illustrated. As described above, the bottom plates of each capacitor 630-633 are connected to a common node. In contrast, the top plates of each capacitor 630-633 are not connected and may each be coupled to a different signal.

To determine a capacitance value for each capacitor 630-633, a sum is calculated for the capacitance of each cell structure included in each capacitor. For example, if the capacitance of each unit capacitor cell 200 is one femtofarads (fF) then the capacitance of each sub-unit capacitor cell is one-half of that of a unit capacitor cell, i.e., 0.5 fF. Assuming that the 'a' column of cell structures (611a-614a) are designed as sub-unit capacitor cells 300 and the other columns (611b-614d) are designed as unit capacitor cells 200, then the capacitance of capacitor 631 is 0.5 fF (612a) plus 1 fF (612b) plus 1 fF (613c) plus 1 fF (613d) for a total of 3.5 fF. Capacitance values for the other capacitors will be 2.5 fF for capacitor 630, 0.5 fF for capacitor 632, and 2.5 fF for capacitor 633.

It is noted that FIG. 6A and FIG. 6B are merely examples. In other embodiments, capacitor array 600 may include various numbers of rows and columns. Capacitors may be created using any suitable number of cell structures and each cell structure may individually be designed as a unit capacitor cell or a sub-unit capacitor cell. The bottom plates may not be connected together as illustrated and one or more top plates may be connected together.

Figure 7:
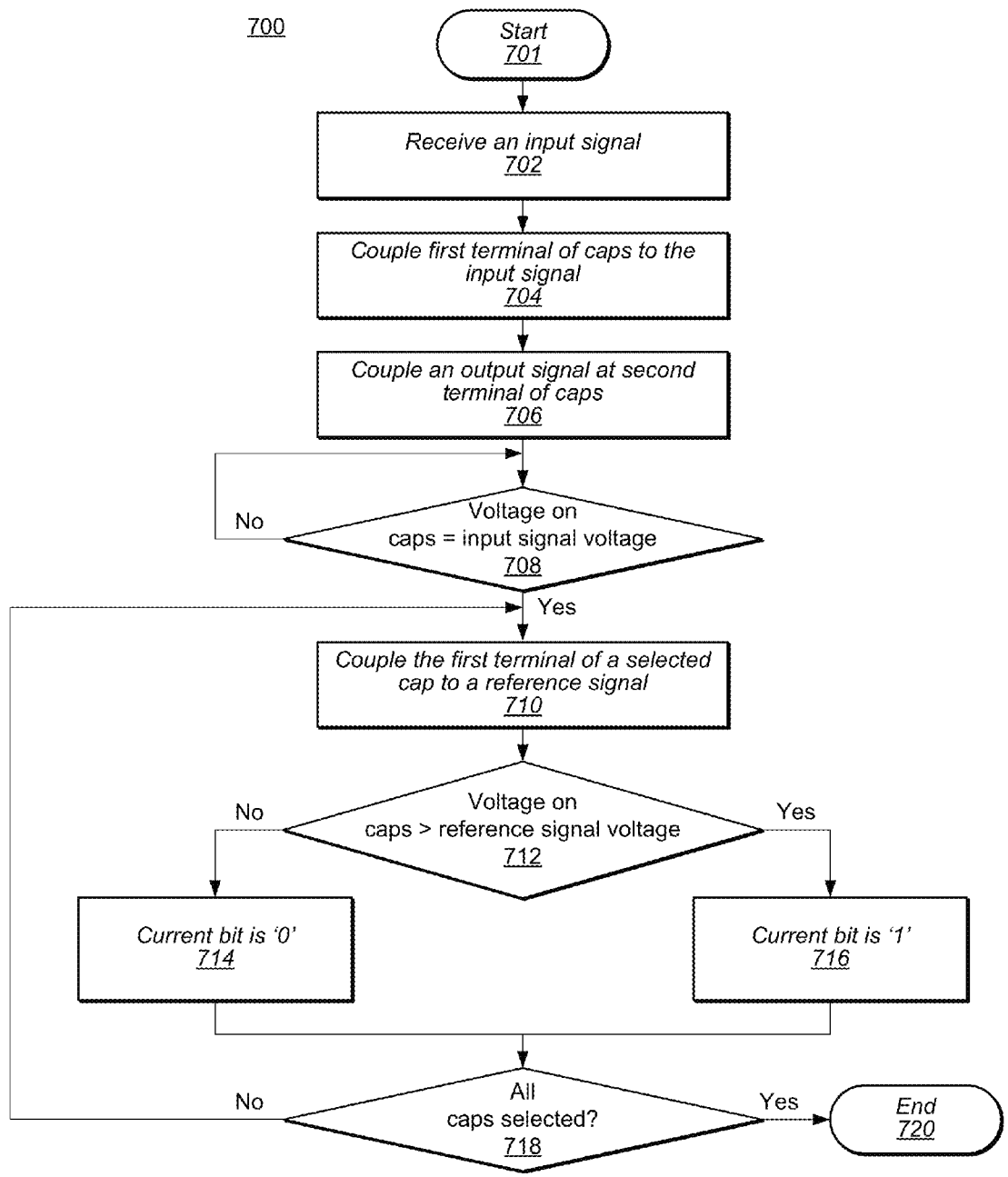
FIG. 7 illustrates a flowchart of a method for operating an embodiment of an analog-to-digital converter.

Turning to FIG. 7, a flowchart of a method for operating an embodiment of an analog-to-digital converter (ADC) is shown. Method 700 may be used to operate a SAR ADC, such as, for example, ADC 100 in FIG. 1. ADC 100 may further include a capacitor array such as, for example, capacitor array 600 in FIG. 6. Referring collectively to FIG. 1, FIG. 6, and FIG. 7, the method may begin in block 701.

ADC 100 receives an input signal (block 702). The input signal corresponds to a signal for which a voltage level is to be measured. The input signal may have a slowly changing (relative to the conversion speed of ADC 100) voltage level. For example, an output of a temperature sensor in an enclosure may change some number of millivolts per second. In other embodiments, the voltage level of the input signal may change more rapidly, such as, e.g., an output of a microphone, which may rise and fall by a volt in less than one microsecond. In some embodiments, in particular to measure a fast transitioning input signal, ADC 100 may sample the input signal for a predetermined period of time to capture the voltage level at a particular point in time.

ADC 100 connects the input signal to a first terminal of a plurality of capacitors in capacitor array 600 (block 702). DAC may include a plurality of switching circuits (e.g., analog multiplexors, transmission gates, etc.) to couple the input signal or other reference signals to each of the plurality of capacitors. In some embodiments, the plurality of capacitors may include all capacitors in capacitor array 600 while in other embodiments, a proper subset of capacitors in array 600 may be included in the plurality of capacitors. SAR control logic 101 adjusts the switching circuits to couple the input signal to the first terminal of each of the plurality of capacitors. The first terminal may correspond to top plates 602 of capacitors 630-633.

SAR control logic 101 adjusts switching circuits to couple bottom plates 604 to a ground reference voltage while top plates 602 are coupled to the input signal (block 706). This adjustment allows capacitors 630-633 to charge to the current voltage level of the input signal. Charging the capacitors to the voltage level of the input signal may be referred to as "sampling" the input signal. It is noted that if the voltage level across capacitors 630-633 begins higher than the voltage level of the input signal, then capacitors 630-633 will discharge rather than charge to reach the voltage level of the input signal.

The further actions of the method may depend on the voltage level across each capacitor of the plurality of capacitors (block 708). In some embodiments, SAR control logic may keep top plates 602 coupled to the input signal and bottom plates 604 coupled to the ground reference for a predetermined amount of time long enough to ensure the voltage level across capacitors 630-633 is equal to the voltage level of the input signal. In other embodiments, comparator 105 may be used to determine that capacitors 630-633 have charged to the voltage level of the input signal. In either embodiment, if the voltage level across capacitors 630-633 is not equal to the voltage level of the input signal, then the method may remain in block 708. Otherwise, the method may move to block 710.

One capacitor of the plurality of capacitors may be selected and charged to the voltage level of a reference signal (block 710). Each capacitor of the plurality of capacitors may correspond to one bit of a digital result determined by ADC 100. For example, if ADC 100 includes a twelve-bit result register, then the plurality of capacitors includes at least twelve capacitors, one for each bit of the result (additional capacitors may also be included for signal conditioning or other purposes). The capacitor corresponding to the most significant bit (MSB) of the digital result has the largest capacitance value of the twelve capacitors. The capacitance value for each subsequent capacitor corresponding to the next most significant bit is one-half of the capacitance of the previous capacitor. A value of each of the capacitors in array 600 in DAC 103 is critical to the accuracy of ADC 100. Capacitors in array 600 may be sensitive to parasitic capacitances from surrounding circuits and from mechanical stress due to temperature changes or physical pressure on the IC. Any mismatch in the capacitances may cause non-linearity issues in the ADC performance, resulting in less accurate results. Use of sub-unit capacitor cell 300 in capacitor array 600 may help to achieve a high degree of capacitance matching between the capacitors in array 600, resulting in accurate performance of ADC 100, even in the presence of mechanical and temperature induced stress. To determine the digital result, each capacitor is selected, one at a time beginning with the MSB capacitor, and the top plate of the selected capacitor is coupled to a first reference voltage signal.

The further actions of the method may again depend on the voltage level across each capacitor of the plurality of capacitors (block 712). After the selected capacitor has been coupled to the reference voltage, the bottom plates 604 of the plurality of capacitors, including the selected capacitor, are coupled to comparator 105 and the voltage level at the bottom plates 604 is compared to a second reference voltage level. The value of the bit corresponding to the selected capacitor is determined by the output of comparator 105.

If the output of comparator 105 is a logic low, then the value of the bit corresponding to the selected capacitor is a '0' (block 714). A logic low from comparator 105 may correspond to the voltage at the bottom plates 604 being less than the second reference voltage.

If the output of comparator 105 is a logic high, then the value of the bit corresponding to the selected capacitor is a '1' (block 716). A logic high from comparator 105 may correspond to the voltage at the bottom plates 604 being greater than the second reference voltage.

Further actions of the method may depend on a number of capacitors selected (block 718). If all capacitors corresponding to a bit of the digital result have not been selected and coupled to the second reference voltage, then the method may return to block 710 to select the next capacitor. Otherwise, method 700 may be complete and end in block 720.

It is noted that, in regards to a Complementary Metal-Oxide-Semiconductor Field-Effect Transistor (or Complementary MOSFET, or simply CMOS) circuit design, "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

It is also noted that method 700 is an example method for operating an embodiment of a SAR ADC. Many embodiments of SAR ADCs are known and methods for operating other embodiments may differ from the operations disclosed in method 700. A different number of operations may be performed and some operations illustrated to occur in series may be performed in parallel.

Figure 8:
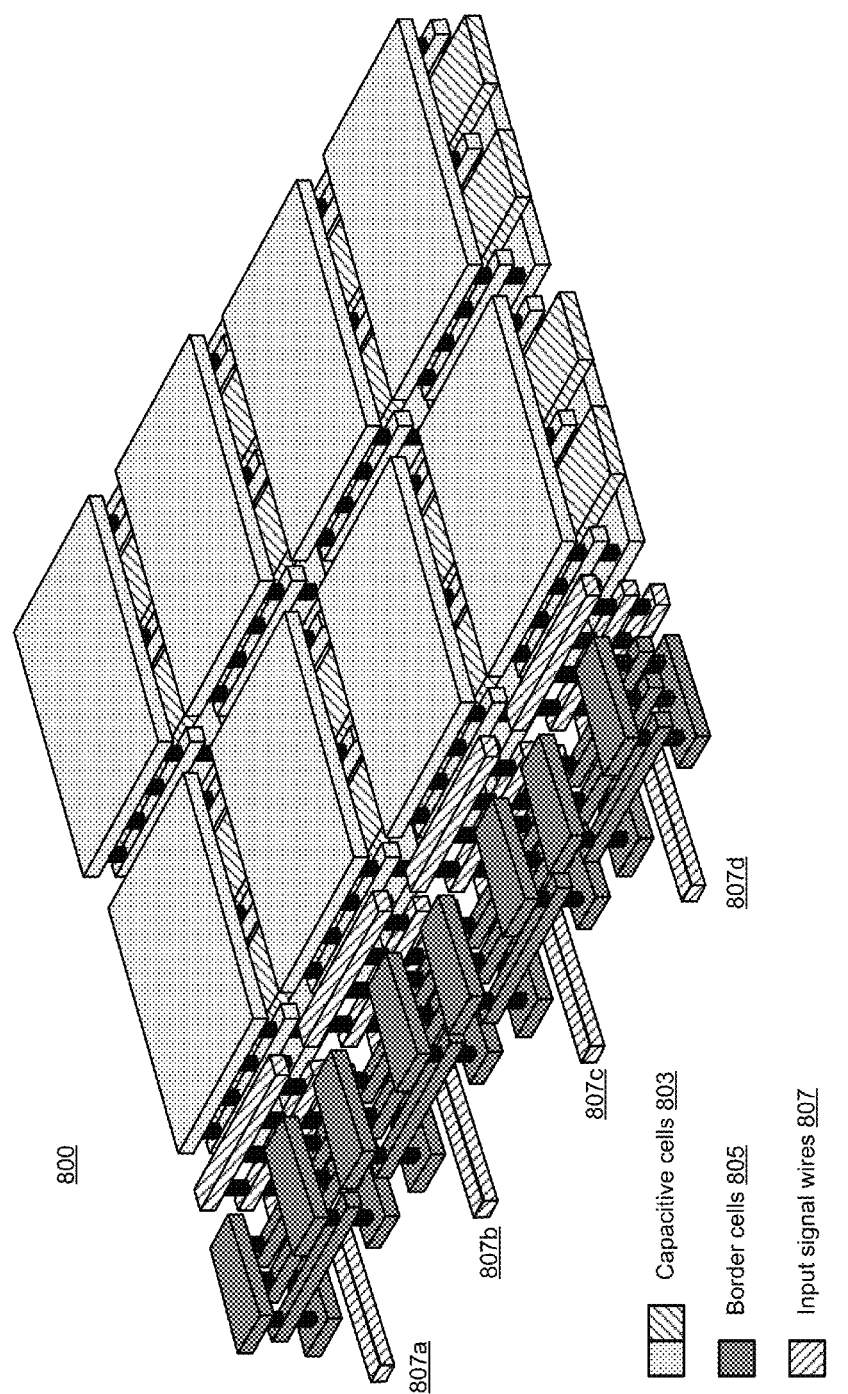
FIG. 8 shows an embodiment of an array of capacitive cells including a row of border cells.

Moving now to FIG. 8, an embodiment of an array of capacitive cells including a row of border cells is presented. Capacitive array 800 includes multiple capacitive unit/sub-unit cells 803 including top plates, third plates and bottom plates. Along an edge of capacitive array 800 is a row of border cells 805. Between capacitive cells 803 and border cells 805 are input signal wires 807 which connect one or more input signals to top plates of one or more capacitive cells 803. Capacitive array may be used, for example, to create capacitors 107 in DAC 103 of SAR ADC 100 in FIG. 1.

Capacitive cells 803 includes multiple cells which are a mix of unit cells such as, e.g., capacitive unit cell 200 in FIG. 2 and capacitive sub-unit cell 300 in FIG. 3. Although eight capacitive cells 803 are illustrated, any suitable number may be included with any suitable mix of unit and sub-unit cells. Each capacitive cell 803 may be connected to one or more other capacitive cells 803 to form one or more capacitors with various capacitances. Referring to the example of DAC 103, several capacitors are created in which successive capacitors have capacitances equal to one-half of a previous capacitor. Input signal wires 807 connect signals, such as, for example, analog input signals from SAR control unit 101, to the capacitors created in capacitive array 800. In the present embodiment, four input signal wires 807*a-d* connect input signals to four capacitors in the array. Between border cells 805 and capacitive cells 803, each input signal wire 807*a-d* includes a stack of wires created in the same metal layers as the capacitive cells. This structure of stacked wires may, in some embodiments, create a more uniform coupling to each capacitor, helping to create a capacitive DAC 103 with capacitors 107 that have more accurate and predictable capacitances thereby allowing for an accurate DAC 103 and consequently an accurate SAR ADC 100.

To further the accuracy of the capacitors created in capacitive array 800, border cells 805 are created next to the wire stacks of input signal wires 807, opposite of capacitive cells 803. Border cells 805 are created in the same metal layers as capacitive cells 803 and are created with a similar structure. For example, conductors are created in the top and bottom layers of the structure and a plurality of parallel wires run in between the top and bottom conductors. Using a similar structure for border cells 805 as for capacitive cells 803 may provide a balance to both electrical coupling of the input signal wires 807 to capacitive cells 803 as well as mechanical stresses due to temperature changes and physical forces on the chip. This balancing of the coupling of the input signals may further improve accuracy of the capacitors in the capacitive array and therefore to SAR ADC 100.

It is noted that the structure of FIG. 8 is merely an example. Other embodiments may include any suitable number of input signals and any number of capacitive cells and border cells. Although three metal layers are shown in FIG. 8, any suitable number of metal layers may be used in other embodiments.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A capacitive device, comprising:
a first conductor formed on a lower metal wiring layer of a plurality of metal wiring layers, wherein the first conductor is coupled to a first terminal;
a second conductor formed on an upper metal wiring layer of the plurality of metal wiring layers; and
a plurality of parallel wires partitioned into a plurality of layers, wherein parallel wires included in each layer of the plurality of layers are formed in a respective one of a subset of the plurality of metal wiring layers, wherein the subset of the plurality of metal wiring layers excludes the upper metal wiring layer and the lower metal wiring layer,
wherein:
a first parallel wire and a second parallel wire of each layer of the plurality of layers is coupled to a second terminal;
a third parallel wire of each layer of the plurality of layers is coupled to the first conductor, wherein the third parallel wire is adjacent to the first parallel wire;
a fourth parallel wire of each layer of the plurality of layers is coupled to the second conductor, wherein the fourth parallel wire is adjacent to the second parallel wire;
a fifth parallel wire of each layer of a first subset of the plurality of layers is coupled to the second conductor, and wherein the fifth parallel wire of each layer of a second subset of the plurality of layers is coupled to the first conductor; and
the fifth parallel wire of each layer of the plurality of layers is adjacent to the first parallel wire and the second parallel wire.

2. The capacitive device of claim 1, wherein the first subset of the plurality of layers is mutually exclusive to the second subset of the plurality of layers.

3. The capacitive device of claim 2, wherein a number of layers included in the first subset of the plurality of layers is equal to a number of layers included in the second subset of the plurality of layers.

4. The capacitive device of claim 1, wherein an edge of the third parallel wire included in a given layer of the plurality of layers is parallel to an edge of the third parallel wire included in any other given layer of the plurality of layers.

5. The capacitive device of claim 1, wherein a dielectric material is included between each adjacent parallel wire in a given layer of the plurality of layers.

6. The capacitive device of claim 1, wherein the second conductor is coupled to a third terminal.

7. The capacitive device of claim 6, wherein the third terminal is coupled to a ground voltage reference.

8. A method comprising:
receiving an input signal;
coupling the input signal to a first terminal of a capacitive device, wherein the capacitive device includes:
a first conductor formed on a lower metal wiring layer of a plurality of metal wiring layers, wherein the first conductor is coupled to the first terminal;
a second conductor formed on an upper metal wiring layer of the plurality of metal wiring layers; and
a plurality of parallel wires partitioned into a plurality of layers, wherein parallel wires included in each layer of the plurality of layers are formed on a respective one of a subset of the plurality of metal wiring layers, wherein the subset of the plurality of metal wiring layers is between the upper metal wiring layer and the lower metal wiring layer,
wherein:
a first parallel wire and a second parallel wire of each layer of the plurality of layers is coupled to a second terminal;
a third parallel wire of each layer of the plurality of layers is coupled to the first conductor, wherein the third parallel wire is adjacent to the first parallel wire;
a fourth parallel wire of each layer of the plurality of layers is coupled to the second conductor, wherein the fourth parallel wire is adjacent to the second parallel wire;
a fifth parallel wire of each layer of a first subset of the plurality layers is coupled to the second conductor, and wherein the fifth parallel wire of each layer of a second subset of the plurality of layers is coupled to the first conductor;
the fifth parallel wire of each layer of the plurality of layers is adjacent to the first parallel wire and the second parallel wire; and
coupling an output signal at the second terminal, wherein the output signal is dependent upon a voltage level across the capacitive device; and
coupling the first terminal to a reference voltage dependent upon a determination that the voltage level across the capacitive device is the same as a voltage level of the input signal.

9. The method of claim 8, further comprising setting a value of a data bit to one in response to a determination that the voltage level across the capacitive device is greater than a voltage level of the reference voltage.

10. The method of claim 8, further comprising determining a value corresponding to the voltage level of the input signal.

11. The method of claim 8, wherein the first subset of the plurality of layers is mutually exclusive to the second subset of the plurality of layers and wherein a number of layers included in the first subset of the plurality of layers is equal to a number of layers included in the second subset of the plurality of layers.

12. The method of claim 8, wherein an edge of the third parallel wire included in a given layer of the plurality of layers is aligned to an edge of the third parallel wire included in any other given layer of the plurality of layers.

13. The method of claim 8, wherein the second conductor is coupled to a third terminal, and wherein the third terminal is coupled to a ground signal.

14. A system comprising:
a plurality of capacitors, wherein at least one capacitor of the plurality of capacitors includes:
a first conductor formed on a lower metal wiring layer of a plurality of metal wiring layers, wherein the first conductor is coupled to a first terminal;
a second conductor formed on an upper metal wiring layer of the plurality of metal wiring layers; and
a plurality of parallel wires partitioned into a plurality of layers, wherein parallel wires included in each layer of the plurality of layers are formed on a respective one of a subset of the plurality of metal wiring layers, wherein the subset of the plurality of metal wiring layers is between the upper metal wiring layer and the lower metal wiring layer,
wherein:
a first parallel wire and a second parallel wire of each layer of the plurality of layers is coupled to a second terminal;

a third parallel wire of each layer of the plurality of layers is coupled to the first conductor, wherein the third parallel wire is adjacent to the first parallel wire;

a fourth parallel wire of each layer of the plurality of layers is coupled to the second conductor, wherein the fourth parallel wire is adjacent to the second parallel wire;

a fifth parallel wire of each layer of a first subset of the plurality layers is coupled to the second conductor, and wherein the fifth parallel wire of each layer of a second subset of the plurality of layers is coupled to the first conductor; and the fifth parallel wire of each layer of the plurality of layers is adjacent to the first parallel wire and the second parallel wire;

a control circuit coupled to the first terminal of each capacitor of the plurality of capacitors, wherein the control circuit is configured to switch a coupling of the first terminal of a given capacitor of the plurality of capacitors from an input voltage signal to a reference voltage signal in response to a determination that a voltage level across the given capacitor is the same as a voltage level of the input voltage signal; and a comparator coupled to the second terminal of each capacitor of the plurality of capacitors.

15. The system of claim 14, wherein the control circuit is further configured to switch a coupling of the first terminal of a given capacitor of the plurality of capacitors between an input voltage signal, a reference voltage signal, and a ground signal.

16. The system of claim 15, wherein the control circuit is further configured to determine a voltage level of the input voltage signal dependent upon an output of the comparator.

17. The system of claim 14, wherein the first subset of the plurality of layers is mutually exclusive to the second subset of the plurality of layers.

18. The system of claim 17, wherein a number of layers included in the first subset of the plurality of layers is equal to a number of layers included in the second subset of the plurality of layers.

19. The system of claim 14, wherein an edge of the third parallel wire included in a given Currently Amended layer of the plurality of layers is aligned to an edge of the third parallel wire included in any other given layer of the plurality of layers.

20. The system of claim 14, wherein the second conductor is coupled to a third terminal, and wherein the third terminal is coupled to a ground signal.

* * * * *